(12) United States Patent
Huang et al.

(10) Patent No.: US 12,051,665 B2
(45) Date of Patent: Jul. 30, 2024

(54) HYBRIDIZATION BUMPS FOR FINE PITCH SENSOR ARRAYS

(71) Applicant: Sensors Unlimited, Inc., Princeton, NJ (US)

(72) Inventors: Wei Huang, Plainsborough, NJ (US); Sungjin Kim, Langhorne, PA (US); Paul L Bereznycky, Medford, NJ (US); Michael J. Evans, Yardley, PA (US); De Hsin Chang, Princeton Junction, NJ (US); Wei Zhang, Princeton, NJ (US)

(73) Assignee: SENSORS UNLIMITED, INC., Princeton, NJ (US)

( * ) Notice: Subject to any disclaimer, the term of this patent is extended or adjusted under 35 U.S.C. 154(b) by 80 days.

(21) Appl. No.: 17/704,341

(22) Filed: Mar. 25, 2022

(65) Prior Publication Data
US 2023/0307398 A1 Sep. 28, 2023

(51) Int. Cl.
 *H01L 23/00* (2006.01)
(52) U.S. Cl.
 CPC .............. *H01L 24/13* (2013.01); *H01L 24/14* (2013.01); *H01L 24/16* (2013.01); *H01L 24/81* (2013.01);
(Continued)

(58) Field of Classification Search
 CPC ....... H01L 2224/12; H01L 2224/1301–13014; H01L 2224/1403; H01L 2224/1405; H01L 2224/14051; H01L 2224/1605; H01L 2224/16052; H01L 2224/16055; H01L 2224/16145; H01L 2224/1703;
(Continued)

(56) References Cited

U.S. PATENT DOCUMENTS

| 4,935,627 A | 6/1990 | Zimmermann et al. |
| 6,410,415 B1 * | 6/2002 | Estes .................. H01L 24/81 |
| | | 257/E21.511 |

(Continued)

FOREIGN PATENT DOCUMENTS

| CN | 110660690 A | 1/2020 |
| JP | 2017201664 A | 11/2017 |

OTHER PUBLICATIONS

Extended European Search Report dated Aug. 21, 2023, issued during the prosecution of European Patent Application No. EP 23162280.4.

*Primary Examiner* — Moin M Rahman
*Assistant Examiner* — Eric Manuel Mulero Flores
(74) *Attorney, Agent, or Firm* — CANTOR COLBURN LLP

(57) ABSTRACT

A system includes a die with a first plurality of hybridization bumps extending therefrom, electrically connected to circuitry die. An external circuitry component with a second plurality of hybridization bumps extending therefrom, electrically connected to circuitry in the external circuitry component. The first plurality of hybridization bumps and the second plurality of hybridization bumps are pressed together for electrical communication between the die and the external circuitry component. The first plurality of hybridization bumps have a different material hardness from the second plurality of hybridization bumps. The first plurality of hybridization bumps have a different bump diameter from that of the second plurality of hybridization bumps.

7 Claims, 3 Drawing Sheets

(52) U.S. Cl.
CPC ........... *H01L 2224/13005* (2013.01); *H01L 2224/13014* (2013.01); *H01L 2224/1403* (2013.01); *H01L 2224/16225* (2013.01); *H01L 2224/81201* (2013.01)

(58) Field of Classification Search
CPC ........... H01L 2224/18; H01L 2224/21; H01L 2224/2105; H01L 2224/22; H01L 2224/2205; H01L 2224/22505; H01L 2224/24135; H01L 2224/24145; H01L 2224/2405; H01L 2224/25; H01L 2224/2505; H01L 2224/81345; H01L 24/10–17; H01L 24/18–25; H01L 24/81; H01L 25/16; H01L 25/167; H01L 27/14634; H01L 27/1465; H01L 27/1467; H01L 27/1469
See application file for complete search history.

(56) References Cited

U.S. PATENT DOCUMENTS

| | | | |
|---|---|---|---|
| 10,566,371 B2 | 2/2020 | Paik et al. | |
| 10,957,733 B2 | 3/2021 | Zhang et al. | |
| 10,971,540 B2 | 4/2021 | Bornfreund et al. | |
| 2008/0142964 A1* | 6/2008 | Sun | H01L 24/11 257/E21.477 |
| 2013/0134582 A1 | 5/2013 | Yu et al. | |
| 2013/0313704 A1 | 11/2013 | Souriau | |
| 2014/0061911 A1* | 3/2014 | Cooper | H01L 24/81 438/107 |
| 2014/0267852 A1* | 9/2014 | Bluzer | H04N 25/713 348/297 |
| 2021/0125950 A1 | 4/2021 | Hisada et al. | |
| 2022/0052020 A1 | 2/2022 | Sonde et al. | |

* cited by examiner

HYBRIDIZATION BUMPS FOR FINE PITCH SENSOR ARRAYS

BACKGROUND

1. Field

The present disclosure relates to sensor arrays such as infrared focal plane arrays, and more particularly to bumps used in hybridizing sensor arrays with other components such as readout integrated circuits (ROICs).

2. Description of Related Art

One of the key challenges for Infrared Focal Plane Arrays (IRFPAs) is the quality of the flip-chip interconnects. Indium bumps are the most common interconnection method. For Ultra Fine Pitch IRFPAs, high quality bump connection requires large bump height to diameter ratio and accurate alignment at pressing. Slight misalignment could result in lower FPA operability by introducing shorted detectors and weakened bump connections.

The conventional techniques have been considered satisfactory for their intended purpose. However, there is an ever present need for improved systems and methods for improved hybridization systems and methods for sensor arrays and flip-chip interconnects such as with ROICs. This disclosure provides a solution for this need.

SUMMARY

A system includes a die with a first plurality of hybridization bumps extending therefrom, electrically connected to circuitry in the die. An external circuitry component with a second plurality of hybridization bumps extending therefrom, electrically connected to circuitry in the external circuitry component. The first plurality of hybridization bumps and the second plurality of hybridization bumps are pressed together for electrical communication between the die and the external circuitry component. The first plurality of hybridization bumps have a different material hardness from the second plurality of hybridization bumps. The first plurality of hybridization bumps have a different bump diameter from that of the second plurality of hybridization bumps.

The die can be a focal plane array (FPA), wherein the circuitry in the die includes an array of pixels. The external circuitry component can be a readout integrated circuit (ROIC), wherein the circuitry in the external circuitry component includes pixel readout support circuitry. A harder one of the first and second pluralities of bumps can have a smaller cross-sectional diameter in a direction of a hybridization axis of the system than a softer one of the first and second pluralities of bumps. The harder one of the first and second pluralities of bumps can have bumps that are of Ni or Ag. The softer one of the first and second pluralities of bumps can be bumps that are of In.

The bumps of the harder one of the first and second plurality of bumps can each have a cross-sectional shape in the direction along the hybridization axis that includes a c-shape. The cross-sectional shape can include two c-shapes that open towards one another for each respective bump. The c-shapes need not all be aligned to open in a single direction.

A method of hybridizing circuit components includes pressing a first plurality of bumps of a first circuit component into respective bumps of a second plurality of bumps of a second circuit component to place the first and second circuit components into electrical communication with one another.

One of the first and second circuit components can be a die, and wherein the other can be an external circuitry component. The first plurality of bumps can be of a harder material than that of the second plurality of bumps so the first plurality of bumps penetrate into the second plurality of bumps. The second plurality of bumps can be larger in diameter than are the first plurality of bumps. Pressing the first plurality of bumps into respective bumps of the second plurality of bumps can include accommodating misalignment of the first and second pluralities of bumps using the larger diameter of the second plurality of bumps. Pressing the first plurality of bumps into respective bumps of the second plurality of bumps can include pressing some material of the second plurality of bumps into c-shaped openings in the first plurality of bumps. Pressing some material of the second plurality of bumps into c-shaped openings in the first plurality of bumps can include pressing material of the second plurality of bumps into an opening between to c-shaped cross-sections in a respective bump of the first plurality of bumps.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
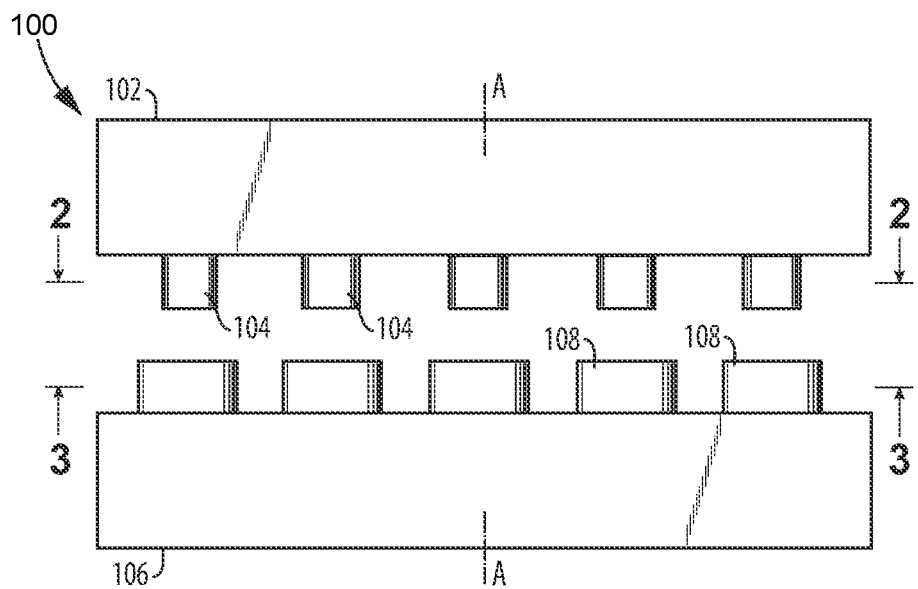
FIG. 1 is a schematic side elevation view of an embodiment of a system constructed in accordance with the present disclosure, showing a photodiode array (PDA) die and a readout integrated circuit (ROIC) aligned for hybridization.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-9, as will be described. The systems and methods described herein can be used to facilitate hybridization of flip chip systems, such as in Ultra Fine Pitch Infrared Focal Plane Arrays (IRFPAs) or the like.

Figure 4:
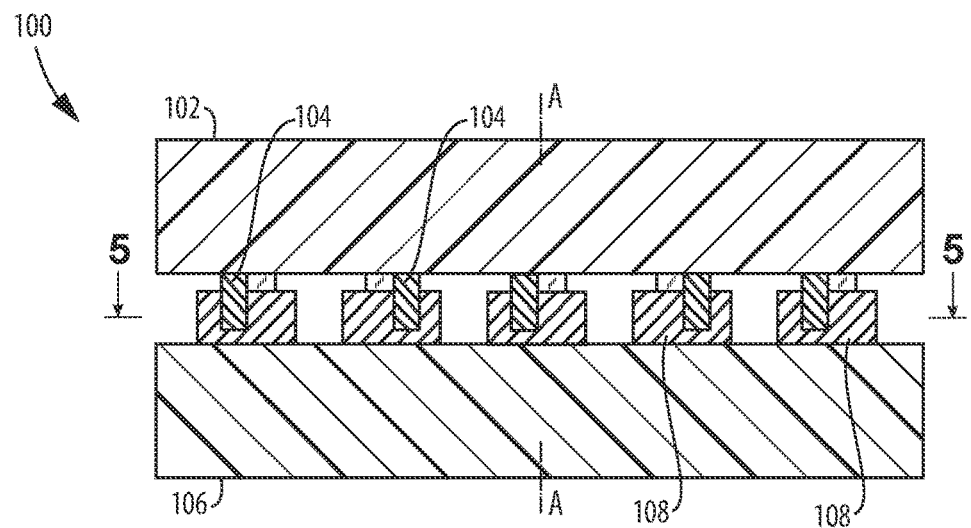
FIG. 4 is a schematic side elevation view of the system of FIG. 1, showing the PDA and ROIC after hybridization.

The system 100 includes a die 102, which can be a photodiode array (PDA), focal plane array (FPA) with an array of image capturing pixels, ultra fine pitch infrared focal plane array (IRFPA), or any other suitable type of die. The die 102 has a first plurality of hybridization bumps 104 extending therefrom, electrically connected to circuitry in the die 102. For example, the bumps 104 can be electrically connected to pixels in the die for outputting imaging data from the die 102 indicative of images focused on the die. An external circuitry component 106, such as a readout integrated circuit (ROIC) with pixel readout support circuitry, is included. The component 104 has a second plurality of hybridization bumps 108 extending therefrom. The bumps 108 are electrically connected to the circuitry in the component 106. During hybridization, the first plurality of bumps 104 and the second plurality of bumps 108 are aligned with one another and pressed together for electrical communication between the die 102 and the component 106. FIG. 1 shows the system 100 prior to hybridization, and FIG. 4 shows the system 100 after hybridization.

The first plurality of bumps 104 have a different material hardness from the second plurality of bumps 108. More particularly, the first bumps 104 are harder than the second bumps 108. This allows the first bumps 104 to largely maintain their shape during hybridization, whereas the second bumps 108 are of a softer material that deforms to conform to the first bumps during hybridization. For example, the first bumps 104 can be of a relatively hard material such as Ni or Ag, whereas the second bumps 108 can be of a relatively soft material such as In.

In addition to having different material hardness, the first bumps 104 have a different bump diameter, e.g. as views in the plane perpendicular to the axis A of the direction of hybridization, from that of the second bumps 108. This difference in diameter can be seen in comparing the diameters d of the bumps 104 in FIG. 2 with the diameters D of the bumps 108 in FIG. 3 (and both diameters d and D can be seen together in FIG. 5).

Figure 2:
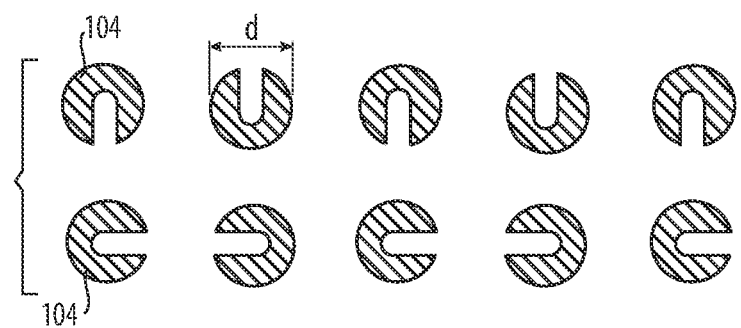
FIG. 2 is a schematic cross-sectional plan view of the bumps of the PDA of FIG. 1, showing the c-shape and diameter of the bumps.
Figure 3:
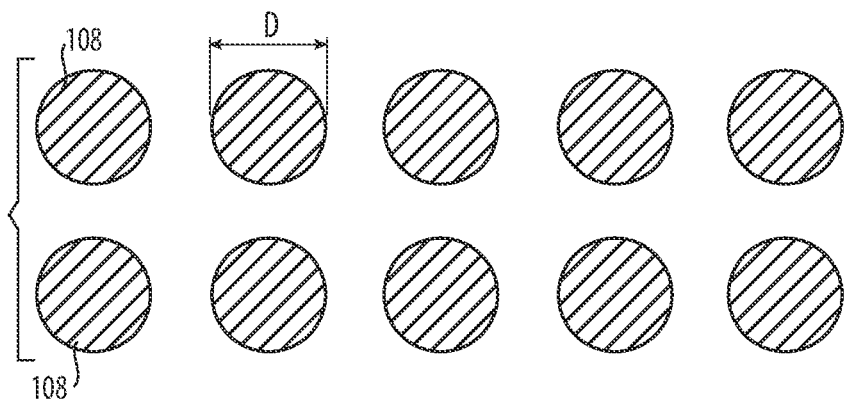
FIG. 3 is a schematic cross-sectional plan view of the bumps of the ROIC of FIG. 1, showing the diameter of the bumps.
Figure 8:
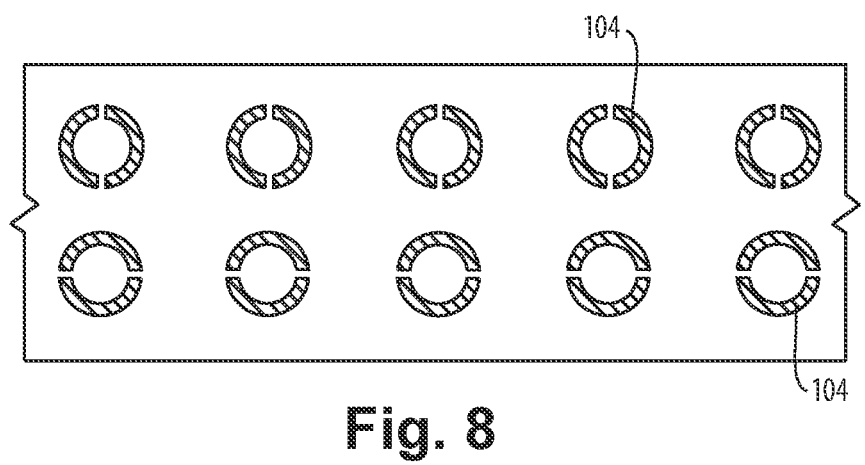
FIG. 8 is a schematic cross-sectional plan view of another set of bumps for the PDA of FIG. 1, showing the bumps before hybridization.
Figure 9:
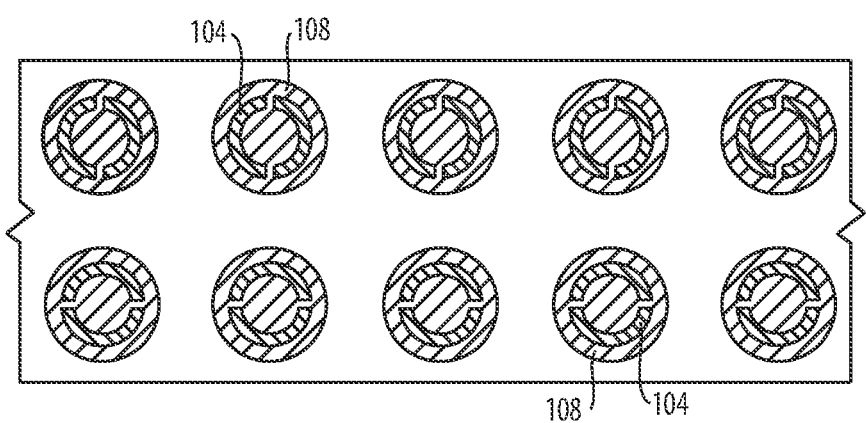
FIG. 9 is a schematic cross-sectional plan view of the bumps of FIG. 8, showing the bumps of the PDA and the bumps of the ROIC after hybridization.

With reference now to FIG. 2, the bumps 104 each have a cross-sectional shape in the direction along the hybridization axis A (i.e. the cross-section as viewed in FIG. 2) that includes a c-shape. The c-shapes of the different bumps 104 can be oriented differently from one another, i.e., they do not all have to open the same direction, but they can follow any suitable pattern of orientations. As shown in FIG. 8, which has the same orientation as FIG. 2, the cross-sectional shape of each of the bumps 104 can include two c-shapes that open towards one another for each respective bump 104. FIG. 9 shows the bumps 104 of FIG. 8 after hybridization with the bumps 108 of FIG. 1.

A method of hybridizing circuit components includes pressing a first plurality of bumps of a first circuit component, e.g. bumps 104, into respective bumps of a second plurality of bumps of a second circuit component, e.g. bumps 108, to place the first and second circuit components into electrical communication with one another. The first bumps 104 penetrate into the second bumps 108, as indicated in FIG. 4.

Figure 6:
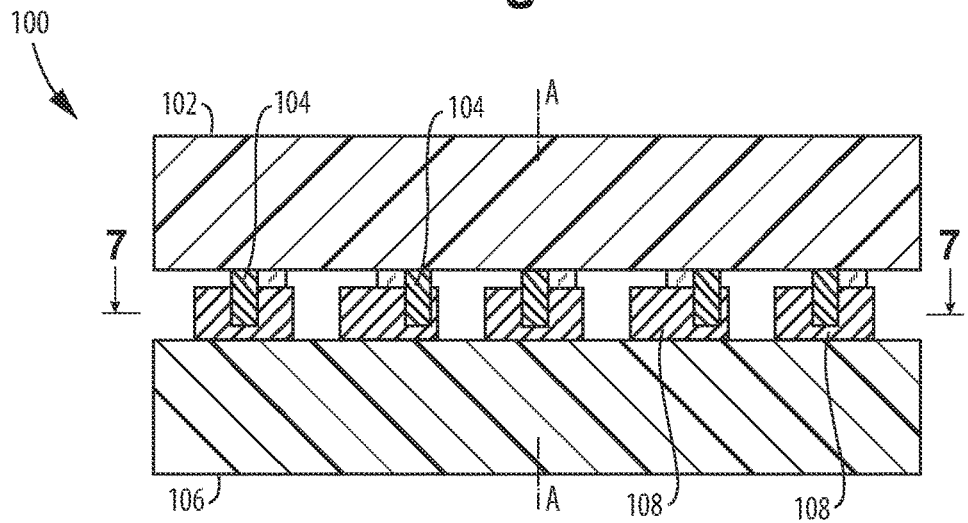
FIG. 6 is a schematic side elevation view of the system of FIG. 1, showing the PDA and ROIC after hybridization with misalignment.
Figure 7:
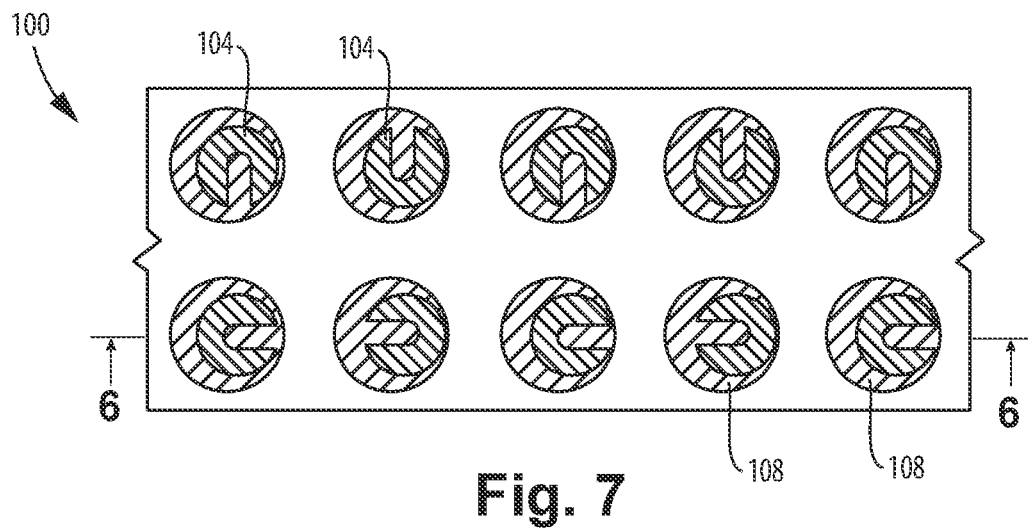
FIG. 7 is a schematic cross-sectional plan view of the system of FIG. 6, showing how the bumps of the ROIC and PDA accommodate the misalignment.

Pressing the first bumps 104 into respective bumps 108 includes accommodating misalignment of the bumps 104, 108 using the larger diameter of the second bumps 108. FIGS. 6-7 show how the bumps 104, 108, with their respective hardness and diameters, can accommodate misalignment of the die 102 and component 106 during hybridization, while avoiding shorting between one pair of mated bumps 104, 108 and another.

Figure 5:
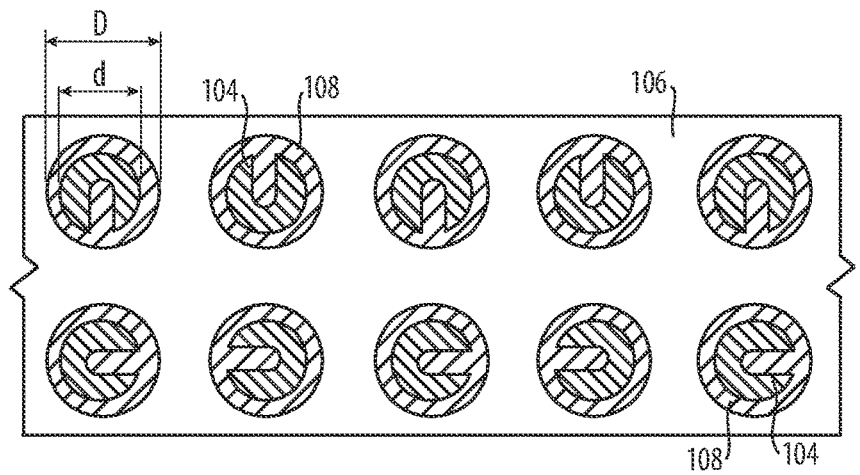
FIG. 5 is a schematic cross-sectional plan view of the bumps of the ROIC and PDA of FIG. 4 after hybridization.

With reference to FIGS. 5, 7, and 9, pressing the first bumps 104 into respective bumps 108 includes pressing some material of the larger, softer bumps 108 into c-shaped openings in the harder, smaller bumps 104. In the case of the double c-shape bumps 104 of FIG. 9, this includes pressing material of the bumps 108 into an opening between the two c-shaped cross-sections in a respective bump 104. These cross-sectional shapes provide extended surface area for contact between the bumps 104, 108 after hybridization, for improved electrical connection relative to more traditional round or square cross-sections, for example.

System 100 is shown and described herein in the exemplary context of the die 102 having the smaller, harder bumps 104 and the component 106 having the larger, softer bumps 108. However, those skilled in the art having had the benefit of this disclosure will readily appreciate that the die 102 can instead have the larger, softer bumps 108, and the component 106 can have the smaller, harder c-shaped bumps 104 without departing from the scope of this disclosure.

The following are potential benefits of systems and methods as disclosed herein. The smaller volume of the "C" shape bumps reduces the bump flattening at pressing, which makes the larger diameter of the "round" bumps possible. The larger diameter of the "round" bump helps improving the alignment and preventing slippage at pressing. The hard bump material and larger bump surface area, e.g. of bumps 104, increase the bump contact area, e.g. between bumps 104 and 108, after pressing. The ability to accommodate misalignment as described above relaxes the alignment tolerance for hybridization. New designs implementing bump arrays as disclosed herein improve Ultra Fine Pitch IRFPAs operability and performance.

The methods and systems of the present disclosure, as described above and shown in the drawings, provide for facilitating hybridization of flip chip systems, such as in Ultra Fine Pitch Infrared Focal Plane Arrays (IRFPAs) or the like. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
   a die with a first plurality of hybridization bumps extending therefrom, electrically connected to circuitry in the die; and
   an external circuitry component with a second plurality of hybridization bumps extending therefrom, electrically connected to circuitry in the external circuitry component,
   wherein the first plurality of hybridization bumps and the second plurality of hybridization bumps are pressed together for electrical communication between the die and the external circuitry component, wherein the first plurality of hybridization bumps have a different material hardness from the second plurality of hybridization bumps, and wherein the first plurality of hybridization bumps have a different bump diameter from that of the second plurality of hybridization bumps, wherein the bumps of the harder one of the first and second plurality of bumps each have a cross-sectional shape in the direction along the hybridization axis that includes a c-shape, wherein the c-shapes are not all aligned to open in a single direction but open in a plurality of directions relative to one another.

2. The system as recited in claim 1, wherein the die is a focal plane array (FPA), wherein the circuitry in the die includes an array of pixels.

3. The system as recited in claim 1, wherein the external circuitry component is a readout integrated circuit (ROIC), wherein the circuitry in the external circuitry component includes pixel readout support circuitry.

4. The system as recited in claim 1, wherein a harder one of the first and second pluralities of bumps has a smaller cross-sectional diameter in a direction of a hybridization axis of the system than a softer one of the first and second pluralities of bumps.

5. The system as recited in claim 4, wherein the harder one of the first and second pluralities of bumps has bumps that are of Ni or Ag.

6. The system as recited in claim 5, wherein the softer one of the first and second pluralities of bumps has bumps that are of In.

7. The system as recited in claim 1 wherein the cross-sectional shape includes two c-shapes that open towards one another for each respective bump.

\* \* \* \* \*